US007285978B1

United States Patent
Devnath

(10) Patent No.: US 7,285,978 B1
(45) Date of Patent: Oct. 23, 2007

(54) CIRCUIT AND METHOD FOR IMPEDANCE CALIBRATION OF OUTPUT IMPEDANCE OF LVDS DRIVER

(75) Inventor: Varadarajan Devnath, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 125 days.

(21) Appl. No.: 11/182,515

(22) Filed: Jul. 15, 2005

(51) Int. Cl.
*H03K 19/003* (2006.01)

(52) U.S. Cl. .......................... 326/30; 326/86; 326/87; 326/21

(58) Field of Classification Search ................. 326/30, 326/86
See application file for complete search history.

(56) References Cited

U.S. PATENT DOCUMENTS 6,762,620 B2 * 7/2004 Jang et al. ..................... 326/30
2006/0087339 A1 * 4/2006 Chung et al. ................. 326/30

* cited by examiner

*Primary Examiner*—Vibol Tan

(57) ABSTRACT

An H-bridge LVDS driver circuit includes a means to calibrate the output impedance of the switches of an LVDS driver to any desired value.

18 Claims, 2 Drawing Sheets

CIRCUIT AND METHOD FOR IMPEDANCE CALIBRATION OF OUTPUT IMPEDANCE OF LVDS DRIVER

TECHNICAL FIELD OF THE INVENTION

The present invention is generally directed to low-voltage differential signal drivers and related circuits.

BACKGROUND OF THE INVENTION

Low-voltage differential signal (LVDS) drivers typically include an H-bridge configuration of switches in series with a termination resistance of, for example, 50 ohms. This requires the switch resistance to be much less than the termination resistance, typically in the range of 1-2 ohms. This makes the switches very large, slowing the output drivers.

An alternate configuration includes an H-bridge of switches in which the switch resistance is tuned to 50 ohms. Since the switch resistance is now 50 ohms instead of ~1-2 ohms, the switches can be smaller by nearly a factor of 50. This makes the LVDS driver useable at a much higher frequency.

Therefore, there is a need in the art for an improved LVDS configuration.

SUMMARY OF THE INVENTION

A preferred embodiment includes an H-bridge LVDS driver circuit that includes a means to calibrate the output impedance of the switches of an LVDS driver to any desired value. Other embodiments include a general purpose circuit that allows calibration of output impedance.

To address the above-discussed deficiencies of the prior art, it is a primary object of the present invention to provide a circuit for providing a calibrated output impedance, and an LVDS driver circuit, each comprising a first programmable switch having a plurality of switchable legs configured to produce a variable impedance; a resistor element connected in series with the first programmable switch; a second programmable switch having a plurality of switchable legs configured to produce a variable impedance, connected in series with the first programmable switch and the resistor element; and a tuning logic element connected to control the first programmable switch and the second programmable switch to produce a desired output impedance.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
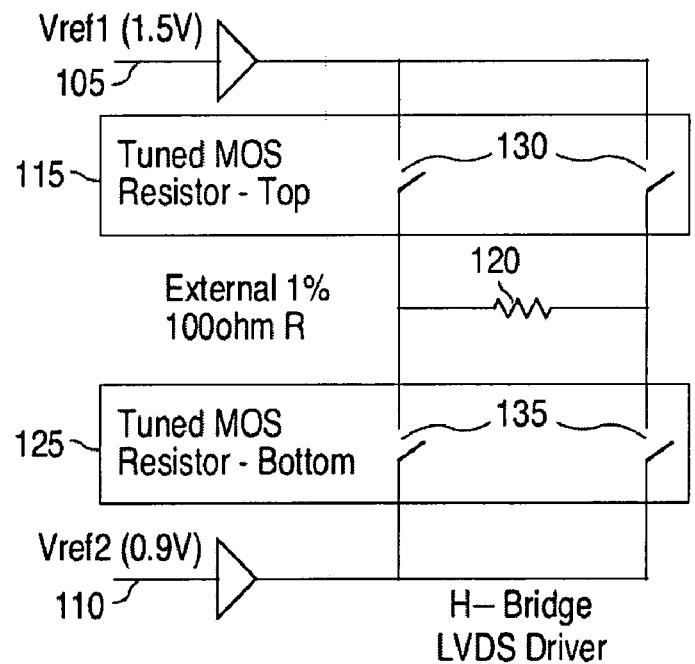
FIG. 1 depicts an exemplary H-bridge LVDS driver circuit in accordance with a preferred embodiment of the present invention.
Figure 2:
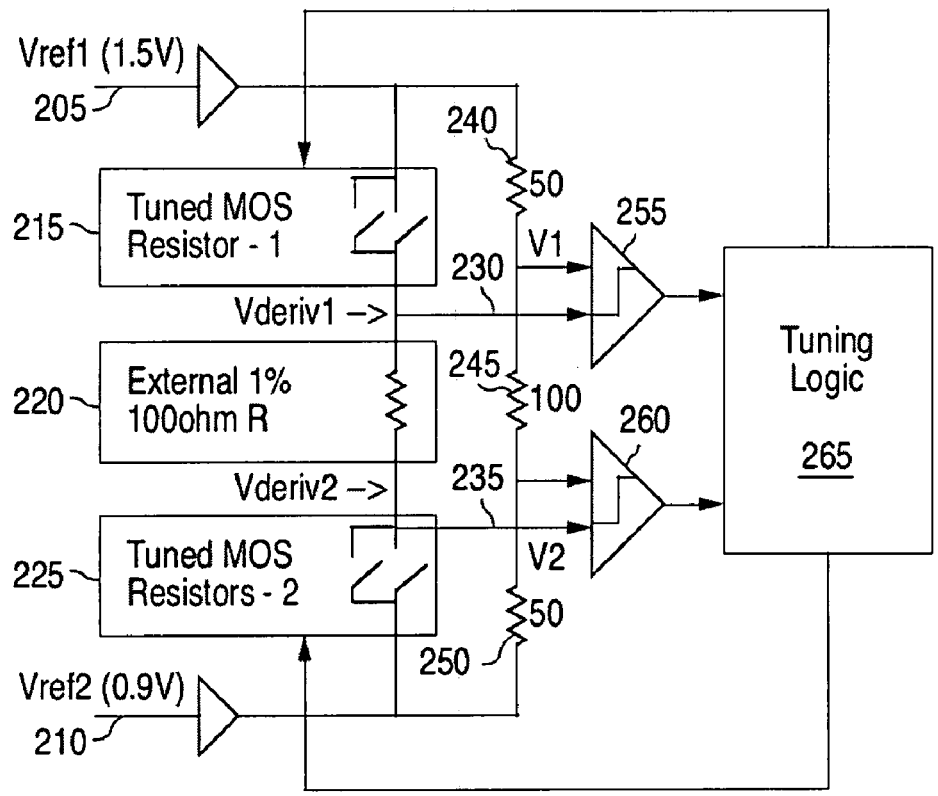
FIG. 2 illustrates a circuit according to an exemplary embodiment of the present invention.
Figure 3:
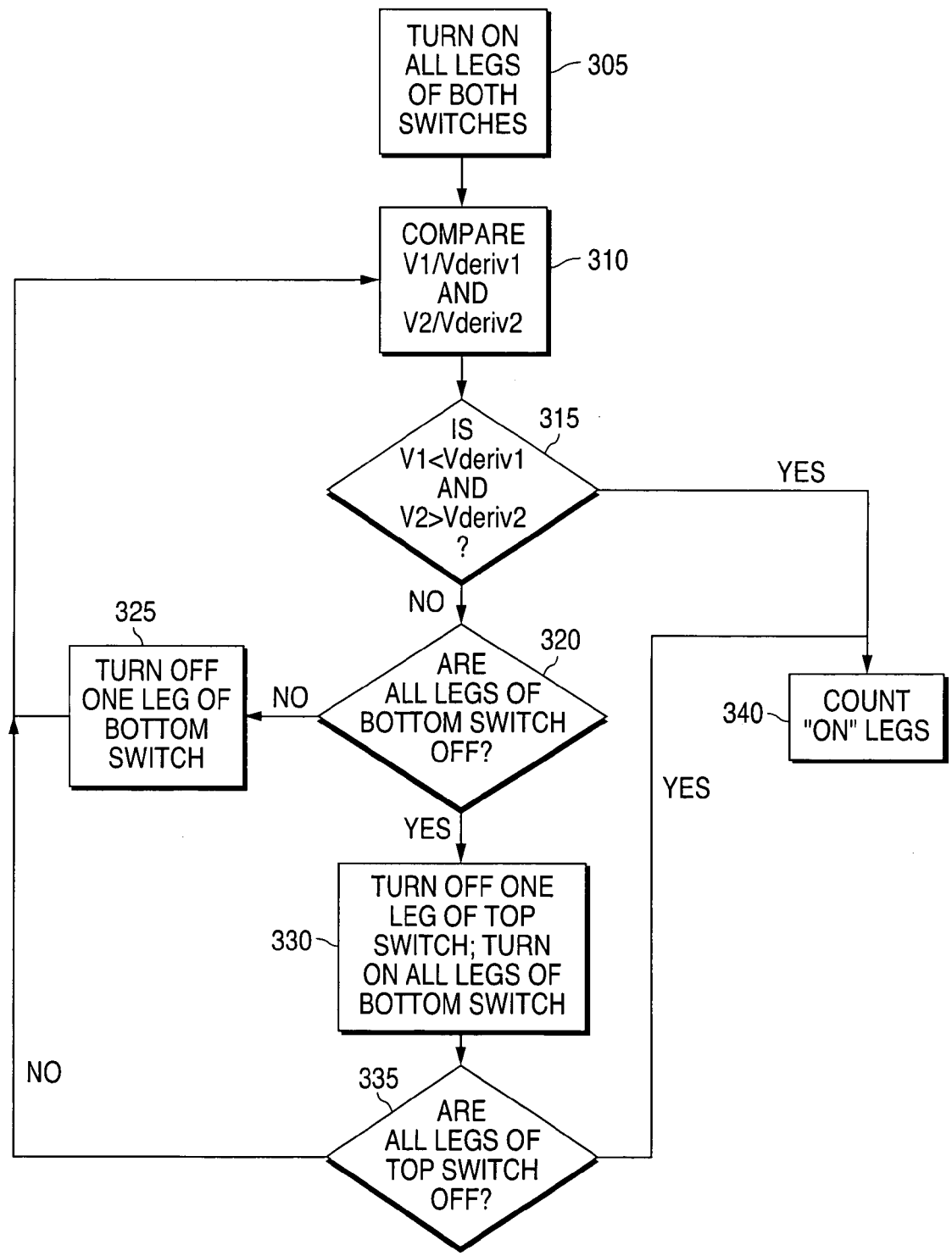
FIG. 3 depicts a flowchart of a tuning algorithm in accordance with a preferred embodiment.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged processing system.

FIG. 1 depicts an exemplary H-bridge LVDS driver circuit in accordance with a preferred embodiment that includes a means to calibrate the output impedance of the switches of an LVDS driver to any desired value. The desired value is usually set by a precision resistor 120 external to the chip. The circuit generates a set of constant reference voltages Vref1 105 and Vref2 110. The circuit requires a precision constant current from a bandgap which is passed through switches 115/125 with programmable impedance. The constant reference voltages are compared to the voltage developed across the switches and the output impedance of the switches is tuned so they become equal to half the external resistor.

In one advantageous application, this circuit can be used to tune the output impedance of an LVDS driver, such as one used for backplane communication in an 8-port Ethernet physical layer device. The LVDS driver has an output impedance requirement for the value to be between 40 and 120 ohms. It also requires a >10% mismatch between the positive and negative end of the driver. In order to minimize signal reflections when the data is launched into a 50 ohm PCB trace, for example, the output impedance of the driver is tuned to 50 ohms.

The disclosed circuit, in a preferred embodiment, tunes the output impedance of a PMOS switch, though this circuit can be implemented equally well with an NMOS switch or a combination NMOS and PMOS switch. The gate of the PMOS switch is connected to 0 volts (ground) to turn on the device and is connected to supply to turn the device off. The impedance of the PMOS switch, between the source and the drain terminals, varies as a function of the supply voltage, processor corners and temperature by a factor of 3:1.

In order to achieve a constant output impedance of an "on" PMOS switch, between the source and the drain, the switch is constructed as a parallel combination of a fixed leg and a number of programmable legs. These programmable legs can be equal in value, binary weighted, or weighted in another appropriate manner. The output impedance of the PMOS switch can be changed by varying the number of programmable parallel legs switched on. The more the number of programmable parallel legs turned on, the lesser the output impedance and vice versa.

The sizes of each of the legs, in a preferred embodiment, are chosen as follows. The fixed leg is chosen so that the impedance of the fixed leg is greater than the desired impedance at the process, supply, and temperature (PVT) corner where the PMOS impedance is the lowest. Each programmable leg is chosen so that the impedance difference between any two adjacent counts of number of legs is less than the desired resolution of the output impedance. The total number of legs is chosen so that the impedance of the PMOS switch when all legs are switched on is less than the desired impedance at the PVT corner where the device impedance is highest. These steps ensure that the PMOS device can be calibrated to the desired value at each PVT.

The H-bridge used in the LVDS driver is preferably replicated in the calibration circuit. In the H-bridge, only two of the four switches are "on" at any one time, one "top" switch and one "bottom" switch. The other "top" switch and "bottom" switch are turned off. Therefore, for the purposes of impedance calibration, only one top switch and one bottom switch is used. Of course, the "top" and "bottom" references here are only for ease of reference with the figures, and do not limit or effect how the switch is actually implemented.

FIG. 2 illustrates a circuit according to an exemplary embodiment of the present invention. The circuit uses two constant reference voltages, Vref1 205 and Vref2 210. These constant reference voltages are preferably exactly the same value as used in the LVDS driver, and in an exemplary embodiment, Vref1=1.5V and Vref2=0.9V. They can be generated by a replica circuit, or share the reference voltage with the LVDS driver, as will be understood by those of skill in the art.

These two constant reference voltages are used to derive two other reference voltages, Vderiv1 230 and Vderiv2 235. These voltages are derived through a resistor divider network 240/245/250:

$$Vderiv1 = \frac{3}{4}Vref1 + \frac{1}{4}Vref2$$

$$Vderiv2 = \frac{1}{4}Vref1 + \frac{3}{4}Vref2$$

The resistors 240/245/250 need not be 50/100/50 ohm resistors, but any resistors, preferably in the ratio 1/2/1. 50/100/50 ohm resistors are used in the exemplary embodiment to provide the voltages in the ratios above.

If R1=top switch 215 impedance and R2=bottom switch 225 impedance, $$V1 = Vref2 + \frac{(Vref1 - Vref2) * R2}{(Rext + R1 + R2)}$$

$$V2 = Vref + \frac{(Vref1 - Vref2) * (Rext + R2)}{(Rext + R1 + R2)}$$

When the tuned resistor values are equal to half the external resistor 220, then $$V1 = \frac{3}{4} * Vref1 + \frac{1}{4} * Vref2 = Vderiv1 \rightarrow (I)$$

$$V2 = \frac{1}{4} * Vref1 + \frac{3}{4} * Vref2 = Vderiv2 \rightarrow (II)$$

Since the value of V1 and V2 depend on both R1 and R2, both the switches must be tuned together for (I) and (II) to be valid. For ease of reference, switch 215 is shown with only two programmable legs, and switch 225 with two programmable legs, although those of skill in the art will recognize that any number of legs can be used, as described herein, and at least a plurality of legs in each switch is preferably used.

V1 and Vderiv1 are input to comparator 255; V2 and Vderiv2 are input to comparator 260. Tuning logic 265 then tunes R1 (top switch) 215 and R2 (bottom switch) 225 as described below. Turning logic can be implemented using a conventional processor or ASIC, as will be recognized by those of skill in the art.

FIG. 3 depicts a flowchart of a tuning algorithm in accordance with a preferred embodiment. First, the PMOS switch is set to the minimum output impedance by switching on all the programmable legs (step 305).

Next, the voltage at V1 is compared to Vderiv1 and voltage at V2 is compared to Vderiv2 (step 310).

Next, if V1<Vderiv1 and V2>Vderiv2 (step 315), the loop is frozen, and go to step 335. Otherwise, where V1>Vderiv1 or V2<Vderiv2, then determine if all legs of bottom switch are off (step 320). If not, turn off one of the "on" legs of the bottom switch (step 325) and return to step 310.

If all the legs of the bottom switch are off (step 320), then turn off one leg of top switch and turn on all legs of bottom switch (step 330). If all legs of top switch are off (step 335), then the loop is frozen; count the number of "on" legs (step 340). Otherwise, repeat to step 310.

Optionally, the process can be repeated several times, and the results averaged, in order to reduce the effects of noise.

Although the present invention has been described with an exemplary embodiment, various changes and modifications may be suggested to one skilled in the art. It is intended that the present invention encompass such changes and modifications as fall within the scope of the appended claims.

What is claimed is:

1. A circuit for providing a calibrated output impedance, comprising:
   a first programmable switch having a plurality of switchable legs configured to produce a variable impedance;
   a resistor element connected in series with the first programmable switch;
   a second programmable switch having a plurality of switchable legs configured to produce a variable impedance, connected in series with the first programmable switch and the resistor element; and
   a tuning logic element connected to control the first programmable switch and the second programmable switch to produce a desired output impedance.

2. The circuit of claim 1, further comprising a voltage divider circuit connected in parallel with the first programmable switch, the resistor element, and the second programmable switch.

3. The circuit of claim 1, wherein the first programmable switch, the resistor element, and the second programmable switch are connected in series between a first reference voltage and a second reference voltage.

4. The circuit of claim 1, wherein the resistor element is a fixed external resistor.

5. The circuit of claim 1, further comprising a first comparator connected to compare the voltage at a node between the first programmable switch and the resistor element and the voltage at a first output of a voltage divider circuit.

6. The circuit of claim 1, further comprising a second comparator connected to compare the voltage at a node between the second programmable switch and the resistor element and the voltage at a second output of a voltage divider circuit.

7. The circuit of claim 1, wherein the tuning logic element receives as input a comparison of voltages derived using the first and second programmable switches and voltages derived from a voltage divider.

8. The circuit of claim 1, wherein the tuning logic element can turn off or on the switchable legs of the first programmable switch to adjust the impedance of the first programmable switch.

9. The circuit of claim 1, wherein the tuning logic element switchable legs of the second programmable switch to adjust the impedance of the second programmable switch.

10. An LVDS driver circuit for having switches with a tuned impedance, comprising:
  a first programmable switch having a plurality of switchable legs configured to produce a variable impedance;
  a resistor element connected in series with the first programmable switch;
  a second programmable switch having a plurality of switchable legs configured to produce a variable impedance, connected in series with the first programmable switch and the second programmable switch; and
  a tuning logic element connected to control the first programmable switch and the second programmable switch to produce a desired output impedance.

11. The LVDS driver circuit of claim 10, further comprising a voltage divider circuit connected in parallel with the first programmable switch, the resistor element, and the second programmable switch.

12. The LVDS driver circuit of claim 10, wherein the first programmable switch, the resistor element, and the second programmable switch are connected in series between a first reference voltage and a second reference voltage.

13. The LVDS driver circuit of claim 10, wherein the resistor element is a fixed external resistor.

14. The LVDS driver circuit of claim 10, further comprising a first comparator connected to compare the voltage at a node between the first programmable switch and the resistor element and the voltage at a first output of a voltage divider circuit.

15. The LVDS driver circuit of claim 10, further comprising a second comparator connected to compare the voltage at a node between the second programmable switch and the resistor element and the voltage at a second output of a voltage divider circuit.

16. The LVDS driver circuit of claim 10, wherein the tuning logic element receives as input a comparison of voltages derived using the first and second programmable switches and voltages derived from a voltage divider.

17. The LVDS driver circuit of claim 10, wherein the tuning logic element switchable legs of the first programmable switch to adjust the impedance of the first programmable switch.

18. The LVDS driver circuit of claim 10, wherein the tuning logic element switchable legs of the second programmable switch to adjust the impedance of the second programmable switch.

\* \* \* \* \*